(12) United States Patent
Cai (10) Patent No.: US 11,477,899 B2
(45) Date of Patent: Oct. 18, 2022

(54) VERTICAL MULTI-FUNCTION DRIVING POWER

(71) Applicant: Changzhou Pengkai Electronics Co., Ltd., Liyang (CN)

(72) Inventor: Yong Cai, Yidu (CN)

(*) Notice: Subject to any disclaimer, the term of this patent is extended or adjusted under 35 U.S.C. 154(b) by 0 days.

(21) Appl. No.: 17/338,145

(22) Filed: Jun. 3, 2021

(65) Prior Publication Data
US 2022/0240398 A1 Jul. 28, 2022

(30) Foreign Application Priority Data

Jan. 28, 2021 (CN) .......................... 202110115115.5

(51) Int. Cl.
*H05K 5/02* (2006.01)
*H05K 5/06* (2006.01)

(52) U.S. Cl.
CPC ............. *H05K 5/0217* (2013.01); *H05K 5/06* (2013.01)

(58) Field of Classification Search
CPC ............................... H05K 5/0217; H05K 5/06
See application file for complete search history.

(56) References Cited

U.S. PATENT DOCUMENTS

| | | | | |
|---|---|---|---|---|
| 5,277,615 A * | 1/1994 | Hastings | ................ | G06F 1/184 |
| 5,467,254 A * | 11/1995 | Brusati | ................ | H05K 9/0039 |
| | | | | 174/355 |
| 9,781,781 B2 * | 10/2017 | Huang | ................ | H05B 45/00 |
| 10,165,638 B1 * | 12/2018 | Wang | .................... | H05B 45/31 |
| 10,455,721 B2 * | 10/2019 | Miura | .................... | H05K 7/1417 |
| 2010/0108863 A1 * | 5/2010 | Yang | .................... | H05B 47/11 |
| | | | | 250/214 AL |
| 2017/0135166 A1 * | 5/2017 | Huang | .................... | H01H 13/06 |
| 2018/0359830 A1 * | 12/2018 | Wang | .................... | H05B 39/044 |
| 2018/0368272 A1 * | 12/2018 | Huang | .................... | H01R 12/718 |
| 2019/0373750 A1 * | 12/2019 | Omote | .................... | H05K 5/061 |
| 2020/0076136 A1 * | 3/2020 | Kuratani | .................... | H05K 7/06 |
| 2020/0106208 A1 * | 4/2020 | Hsieh | .................... | H05K 5/069 |

* cited by examiner

*Primary Examiner* — Hung S. Bui
*Assistant Examiner* — Sagar Shrestha
(74) *Attorney, Agent, or Firm* — Rumit Ranjit Kanakia (57) ABSTRACT

The present invention relates to the field of driving power technologies, and in particular, to a vertical multi-function driving power, which includes an integrally formed shell, an end cover, a waterproof socket, a sealing cover, and a circuit board. One end of the shell is closed and the other end is provided with an opening. The opening end of the shell is detachably connected to an inner side surface of the end cover, the waterproof socket is integrally formed on an outer side surface of the end cover, at least one key hole penetrates through an upper side surface of the shell, and the sealing cover is mounted in the key hole to seal it. The circuit board is provided with a key column perpendicular to a substrate, and two inner side surfaces adjacent to the side surface where the key hole is located inside a cavity of the shell are provided with mounting blocks symmetrically. Clamping blocks are arranged symmetrically on the inner side surfaces of the end cover, and the clamping blocks each have a "Y"-shaped notch. The vertical multi-function driving power provided by the present invention has desirable waterproof and moisture-proof effects, and can effectively solve the problems that the circuit board is not easy to mount, the sealing cover is easy to fall off, and multiple groups of key switches cannot be additionally arranged.

8 Claims, 6 Drawing Sheets

FIG. 13 tion of the LED device. As for the hole opened on the tail cover of the vertical driving power and the structural design of the seal, when the seal is mounted in the hole, a certain degree of waterproof function can be achieved; however, rainwater can still easily flow into the interior of the power shell through a gap between the seal and an edge of the hole. In the actual operation process, one key switch is inconvenient to realize operations of not only changing a flash mode but also changing a lighting color, timing, dimming, and other functions of a lamp. The switch of the vertical driving power is arranged at the tail cover, and the switch is welded on one end of the circuit board close to the tail cover. The free end of the switch protrudes into the hole of the tail cover to abut against the seal. As can be known, limited by the assembly space, the position structure of the tail cover, and the area of the mounting hole, the structural design of this vertical driving power is inconvenient to add multiple groups of key switches according to different usage scenarios.

VERTICAL MULTI-FUNCTION DRIVING POWER

TECHNICAL FIELD

The present invention relates to the field of driving power technologies, and in particular, to a vertical multi-function driving power.

BACKGROUND

With the rapid development of LED technologies, LED devices are increasingly closely related to people's daily life and industrial production. An LED driving power is a power converter that converts the power supply into a specific voltage current to drive an LED to emit light, and is an important component of the LED device. There are two types of driving power supplies: a vertical driving power and a horizontal driving power. The LED driving power mainly includes a power case, a circuit board, and a key switch. By pressing the key switch, the circuit board is enabled to generate a control signal, thereby changing a light-emitting mode of an LED lamp, so as to achieve different lighting effects. As LED devices are often used outdoors, they are easily affected by the wet weather such as rain, snow, and fog. In order to meet the requirements of different use environments, the LED driving power needs to have waterproof and moisture-proof functions. Usually, a waterproof case is arranged outside the LED driving power for waterproof protection and heat dissipation, so as to prevent internal components from being immersed in water and damp and short-circuited, affecting the service life of the LED device, and even causing serious safety hazards.

Figure 1:
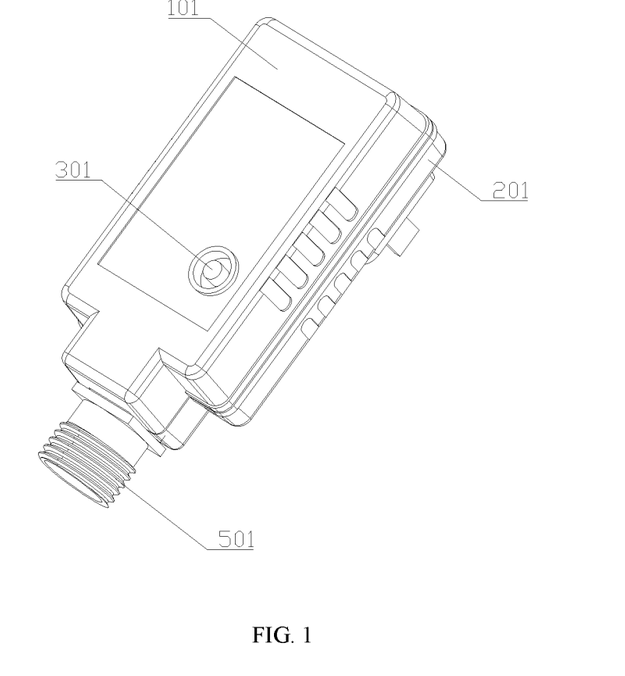
FIG. 1 is a schematic diagram of a three-dimensional structure of an existing horizontal driving power.
Figure 2:
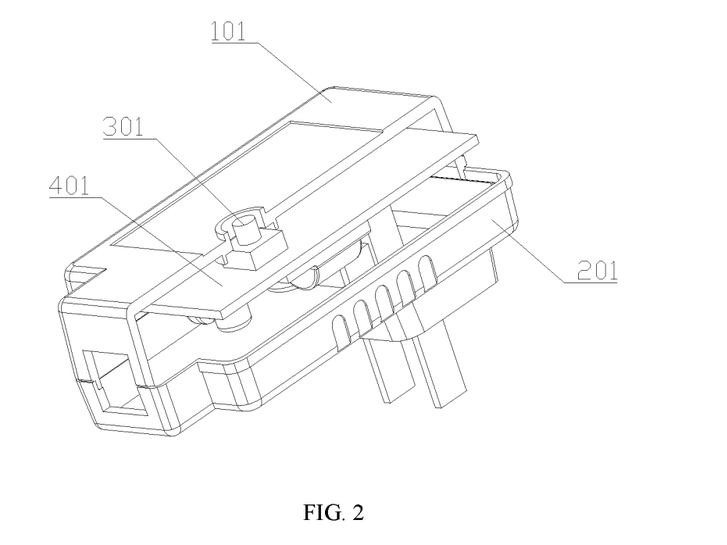
FIG. 2 is a schematic structural diagram of the power of FIG. 1 with an output waterproof socket and part of an upper cover removed.
Figure 3:
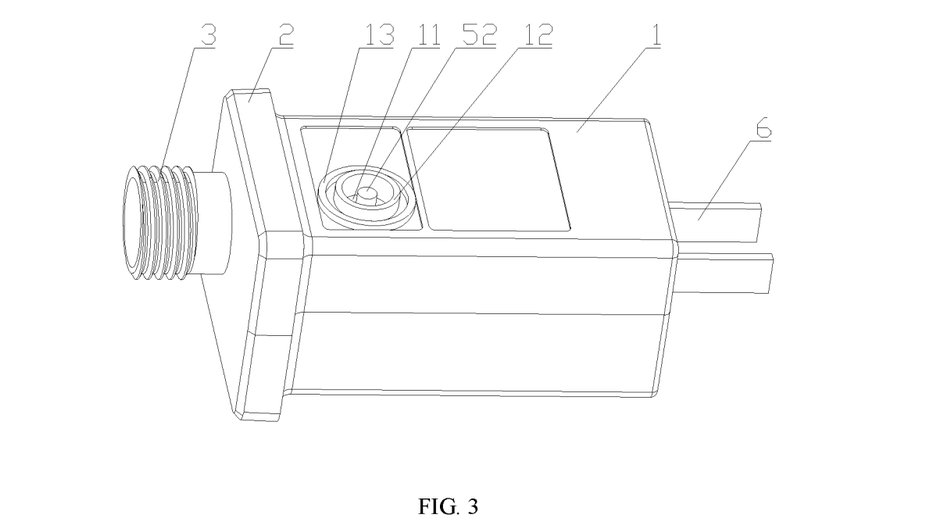
FIG. 3 is a schematic diagram of a three-dimensional structure of a vertical multi-function driving power according to the present invention.
Figure 4:
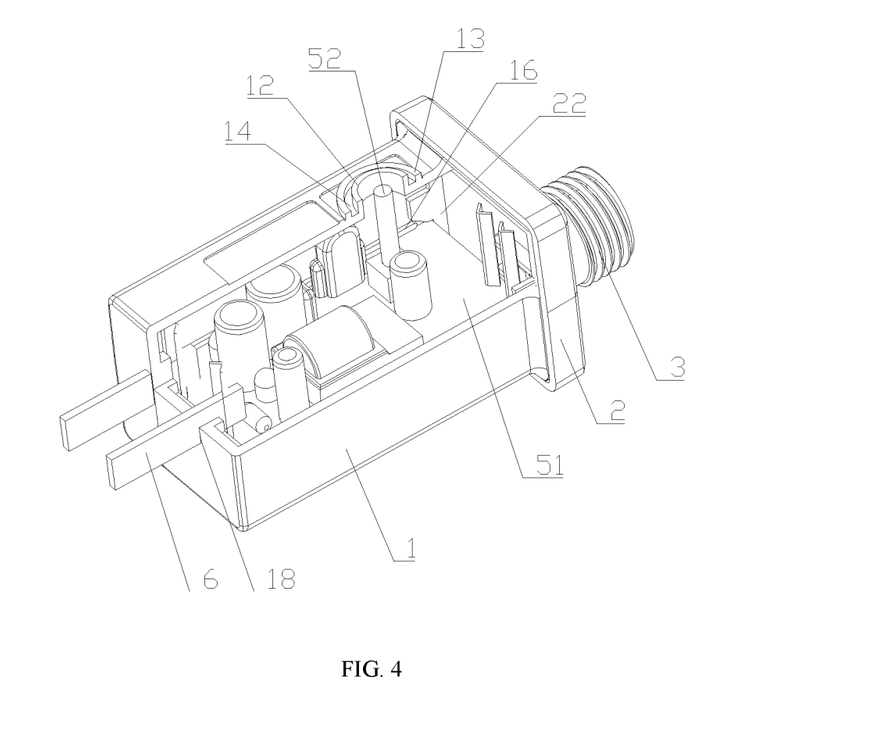
FIG. 4 is a schematic diagram of a three-dimensional structure according to the present invention with part of a shell hidden.
Figure 5:
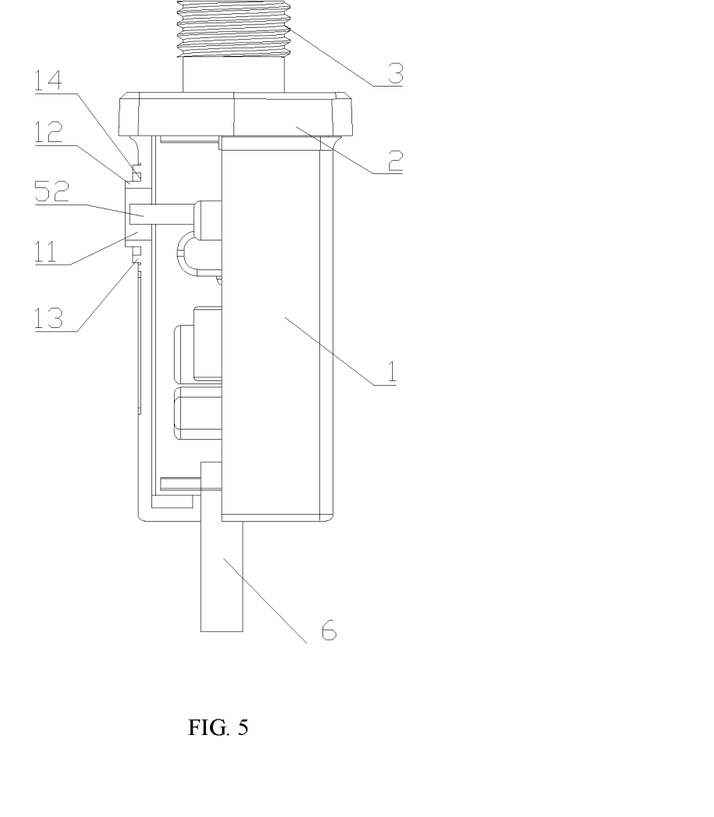
FIG. 5 is a schematic diagram of a side surface structure of FIG. 4 according to the present invention.
Figure 6:
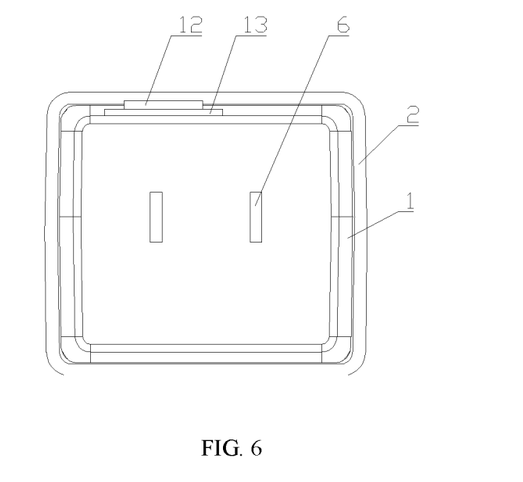
FIG. 6 is a schematic diagram of a right side view structure of a vertical multi-function driving power according to the present invention.
Figure 7:
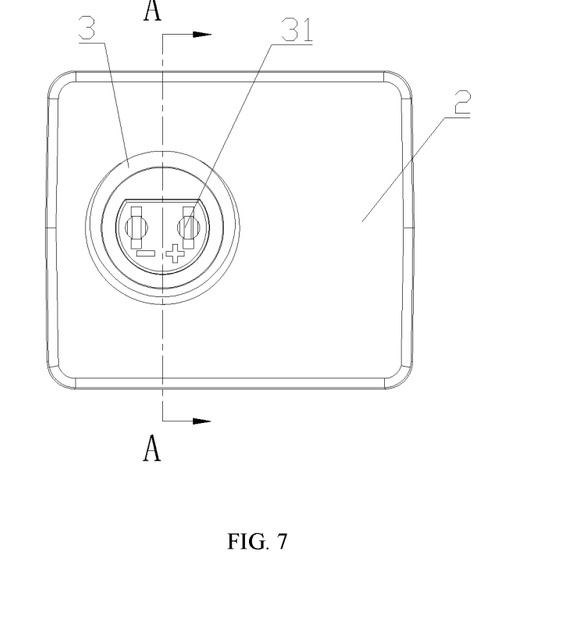
FIG. 7 is a schematic diagram of a left side view structure of a vertical multi-function driving power according to the present invention.

At present, an LED driving power with a control key switch available on the market mostly adopts a horizontal power structure, and a power case is mostly assembled by closing upper and lower covers together. As shown in FIG. 1 and FIG. 2, the horizontal driving power includes upper cover 101, lower cover 201, conductive key 301, circuit board 401, and output waterproof socket 501. Upper cover 101 is provided with a mounting hole. During assembling, conductive key 301 is mounted in the mounting hole, circuit board 401 is mounted inside the power case, and output waterproof socket 501 is mounted in a groove at a tail of upper cover 101. After lower cover 201 is closed, ultrasonic waves are used to weld gaps between output waterproof socket 501, upper cover 101, and lower cover 501 to form a seal. By pressing conductive key 301, a conductive film on conductive key 301 is in contact with a carbon film on the circuit board, thereby generating a pulse signal to the circuit board, and a processor on circuit board 401 can output a corresponding control signal after receiving the pulse signal, thus controlling a load so that the load emits light with different effects. Upper cover 101 and lower cover 201 of this horizontal driving power are made of a PC material, and output waterproof socket 501 is made of a PVC material. The power case is formed by assembling components of different materials and then sealing them by ultrasonic welding, but components of different materials cannot be completely fused together by ultrasound, there will still be some small gaps in the contact part of the PVC and PC materials, resulting in the problem of poor sealing and waterproof performance of the power case.

To solve the problem of poor waterproof effect of the case of the horizontal driving power, a vertical driving power has emerged on the market, in which an output waterproof socket and a shell are formed integrally. A vertical driving power for a lamp is disclosed in the invention patent No. CN 105338703B. The power includes an integrally formed shell and a tail cover. One end of the shell is closed and the other end has an opening. The tail cover is fixedly connected to the opening end of the shell, and the tail cover is provided with a hole. The power further includes a circuit board having a control circuit, a switch for generating a pulse signal, and a seal. At least a part of the circuit board is mounted in a cavity of the shell, one end of the switch is welded and fixed to the circuit board, and the other end of the switch is a free end. The seal is mounted in the hole on the tail cover to seal the hole. After the tail cover is fixed to the shell, the seal abuts against the free end of the switch, and one end of the seal is exposed to the air. Although this vertical driving power solves the waterproof problem of the traditional LED horizontal driving power, it has caused the following new problems: a direction of pressing the switch is the same as an axial direction of the circuit board, and when the free end of the switch is pressed, a force-receiving area at a welding part where the switch and the circuit board are fixedly connected is small, and the welding part bears a large force per unit area when pressed. If the switch is used and pressed for a long time, the welding part of the switch is prone to tilt or even damaged and fall off. As for the hole opened on the

SUMMARY OF THE INVENTION

Aiming at the shortcomings in the prior art, the present invention provides a vertical multi-function driving power, which is simple in structure, convenient in assembly, and excellent in sealing effect, and is waterproof and moisture-proof. Multiple groups of key switches can be arranged according to different use requirements, which can effectively solve the problems such as that the waterproof and moisture-proof effects of the power shell is undesirable, the key switch is easy to be damaged, multiple groups of key switches cannot be added, and the sealing cover is easy to fall off. Moreover, the problems of insensitive key and poor waterproof effect of a vertical driving power with a side key switch when mounted on a circuit board, caused by that the key switch cannot fully protrude into the interior of a key hole and a gap is easily generated between the key switch and the sealing cover, can also be solved.

In order to solve the above technical problems, the technical solution of the present invention is implemented in the following methods:

A vertical multi-function driving power includes an integrally formed shell, an end cover, a waterproof socket, a sealing cover, and a circuit board of a control circuit. One end of the shell is closed and the other end is provided with an opening. The opening end of the shell is detachably connected to an inner side surface of the end cover, and the waterproof socket is integrally formed on an outer side surface of the end cover. At least one key hole penetrates through an upper side surface of the shell, an axial direction of the key hole is perpendicular to an axial direction of the shell, and the sealing cover is mounted in the key hole to seal it.

The circuit board is provided with a key column perpendicular to a substrate, for switching pulse signals, two inner side surfaces adjacent to the side surface where the key hole is located inside a cavity of the shell are provided with mounting blocks symmetrically, and clamping blocks are arranged symmetrically on the inner side surfaces of the end cover, the clamping blocks each have a "Y"-shaped notch, when the opening end of the shell and the end cover are connected together, the "Y"-shaped notch of the clamping block is clamped with one end of the circuit board, the mounting block and the clamping block fix the circuit board in a position inside the cavity of the shell and parallel to an axial direction thereof, the clamping block completely protrudes into the cavity of the shell, and a movable end of the key column protrudes into the key hole and is closely attached to the sealing cover.

In the above technical solution, the shell is integrally formed, and the waterproof socket and the end cover are also designed integrally. The end cover and the shell are assembled together and then fused through ultrasound, and because the shell, the end cover, and the waterproof socket are made of the same material, the various components can be fused with each other to ensure excellent sealing and waterproof effects of the power. The key hole is arranged on the side surface of the shell with a large area, and multiple groups of key holes may be arranged on the side surface of the shell to mount the key switches according to actual needs. Compared with the key switch welded in parallel on a plane of the circuit board substrate, the key column welded vertically on the circuit board substrate changes the force-receiving direction and force-receiving area of the welding point when the switch is pressed. For the structural design in the above technical solution, when the key switch is pressed, the welding point and the circuit board substrate share and disperse the pressure, and the key switch is not easy to tilt or even break off after a long time of use. Moreover, the key column occupies a small space on the substrate, and it is convenient to add multiple groups of key switches at different positions on the side surface. By arranging a mounting block on the inner side wall surface of the cavity of the shell, after the end cover and the opening end of the shell are clamped and closed to each other, the "Y"-shaped notch of the clamping block is clamped to one end of the circuit board, the mounting block and the clamping block stably fix the circuit board in a position inside the shell cavity and parallel to the axial direction thereof. At this time, the clamping block completely protrudes into the interior of the shell cavity, so the movable end of the key column can just protrude into the key hole and is closely attached to the sealing cover, thereby completing the mounting and positioning of the circuit board, and achieving desirable sealing and waterproof effects for the key hole.

Further, the mounting block and the shell are integrally formed to ensure the mounting stability of the circuit board. The upper surface of the mounting block gradually extends straight upward from the opening end of the shell to the closed end of the shell, and forms an included angle of 0 to 45 degrees with a lower side surface of the shell.

Because the height of the key column vertically arranged on the circuit board is higher than other components on the circuit board, when the circuit board is mounted into the interior of the shell cavity, the problem that the key column is stuck at the opening end of the shell and cannot be put into the cavity thereof due to the excessive height may occur. If the circuit board is mounted into the shell and is closely attached to the bottom surface of the shell in parallel, the movable end of the key column cannot protrude into the key hole, and cannot be closely attached to the sealing cover mounted in the key hole, thus having problems such as insensitive keys, easily generated gaps when pressing the sealing cover, and poor waterproof effect in the process of using the key. In order to solve these problems, through the above technical solution, the mounting block is designed as a structure with an inclined upper surface. The circuit board can be placed on an inclined plane formed by the two mounting blocks and inserted into the interior of the shell in an inclined manner along the upper surfaces of the mounting blocks. The circuit board is fixed in a horizontal position through cooperation of the "Y"-shaped notch of the clamping block and the mounting block, and the key column can just protrude into the key hole and make close contact with the sealing cover, thereby solving the problems that the key column cannot be mounted into the interior of the shell due to the excessive length and that the key column cannot be closely attached to the sealing cover.

Further, the included angle formed between the upper surface of the mounting block and the lower side surface of the shell is 0 to 15 degrees. An inclination angle of the mounting block may be adjusted according to the height of the key column and the size of the shell, which can be adapted to different power size designs.

Further, the two inner side surfaces where the mounting blocks are located are each provided with a limiting block, and the limiting block is integrally formed with the shell to ensure the stability of the structure. The limiting block is located above the mounting block and is parallel to the axial direction of the shell, and a gap between the mounting block and the limiting block is used for mounting the circuit board. Through the above technical solution, when the end cover is closed on the shell and the circuit board is mounted in a position parallel to the axial direction of the shell, the lower surface of the limiting block is closely attached to the upper surface of the circuit board, and the limiting block arranged horizontally above the mounting block is used to fix and limit the position of the circuit board, thus preventing it from shaking inside the shell.

Further, an inner surface and an outer surface of the opening end of the shell respectively extend outward and form a non-closed clamping slot in the middle, and the inner side surface of the end cover is provided with an outer rib that is in clamping fit with the clamping slot. An inner ring of the outer rib is provided with an inner rib, and the clamping block is arranged on the inner rib. When the end cover is closed and connected to the opening end of the shell, the outer rib is clamped inside the clamping slot, and the inner rib is closely attached to the inner surface of the opening end of the shell. Through the mutual clamping of the outer rib, the inner rib, and the clamping slot, and the mutual fitting of the end cover case and the clamping block, the stability of the mutual connection between the end cover and the shell as well as desirable double-layer sealing and waterproof effects are ensured.

Further, one end of the key hole opposite to the outer surface of the shell extends outward to form a first extension portion, a second extension portion integrally formed with the shell is arranged surrounding the exterior of the first extension portion, a groove is formed between the first extension portion and the second extension portion, and the height of the first extension portion is not lower than the height of the second extension portion. By arranging the first extension portion, water vapor is prevented from entering the key hole from the exterior of the shell and flowing into the interior of the power. By arranging the second extension portion, the edge of the sealing cover mounted in the key hole can be prevented from being easily scratched and displaced and falling off during use, thereby enhancing the waterproof and moisture-proof effects.

Further, the sealing cover is made of an elastic material and includes a cylindrical body and a cover top. One end of the cylindrical body is closed to form a cover top, and the other end is provided with an opening. The cover top includes a horizontal extension portion, a lower edge portion, and a key cap located on the horizontal extension portion, and the diameter of the horizontal extension portion is slightly greater than the diameter of the key hole; when the cylindrical body is inserted into the key hole, the horizontal extension portion and the lower edge portion wrap the exterior of the first extension portion, and has sealing, water-proof, and moisture-proof functions. The length of the lower edge portion is 2/3 of the length of the cylindrical body. The length of the lower edge portion is prolonged, so that it can be better wrap the first extension portion to enhance the sealing and waterproof effects.

Further, the key cap extends into the interior of the cylindrical body to form a trigger part. After the circuit board is mounted in the shell, the key column can be tightly pressed against the surface of the trigger part, and the key cap is pressed externally. The key column is pressed by the trigger part, thereby forming a channel to generate a pulse signal. An edge of an opening end of the cylindrical body extends radially around to form a limiting flange, the diameter of the limiting flange is slightly greater than the diameter of the key hole, and the limiting flange, after passing through the key hole, is closely attached to the inner surface of the shell, for fixing the position of the sealing cover and preventing it from falling off.

Further, a thread is arranged on the outer surface of the waterproof socket and an output wiring hole is arranged inside for connecting to an external LED device.

Further, the closed end of the shell is provided with an input wiring hole, and a conductive insertion is sealed and fixedly mounted in the input wiring hole to connect the circuit board and a high-voltage power supply.

Compared with the prior art, the present invention has the following advantages:

(1) The vertical multi-function driving power provided by the present invention not only has an integrally formed shell, but also has an end cover and a waterproof socket that are designed integrally. They are all made of the same PC material, the sealing and waterproof effects are better after ultrasonic fusion, and the production cost can be obviously saved. Moreover, the double-layer sealing design of the clamping slot and the rib that fit each other on the opening end of the shell and the inner side surface of the end cover ensures a stronger waterproof effect of the power case.

(2) The mounting block and limiting block provided inside the cavity of the power shell of the present invention fit the structural design of the clamping block with a "Y"-shaped notch in the end cover, which avoids the problem that when a whole vertical circuit board with a perpendicular key column is mounted into the shell, the key component is too long to mount and place, and there is a gap between the key column and the sealing cover, so the mounting stability of the circuit board is undesirable. The circuit board with the long perpendicular key column is first inserted into the power shell in an inclined manner along the surface of the mounting block to ensure that the key column can fully enter the interior of the power shell, and then the circuit board is stably fixed in a position parallel to the axial direction of the shell through the clamping block and the limiting block, thus ensuring that the circuit board is mounted more stably and is not easy to shake. At the same time, the key column on the circuit board can just protrude into the key hole and is closely attached to the trigger part inside the sealing cover without leaving a gap. The pulse signals are stimulated by pressing to switch between different working modes, thus improving the waterproof function, and also enhancing the key sensitivity.

(3) The unique structural design of the first extension portion and the second extension portion in the key hole of the power shell provided by the present invention, combined with the unique sealing cover structure, can effectively prevent water from flowing through the gap between the sealing cover and the edge of the through hole into the interior of the driving power to cause a short circuit, and can also prevent the sealing cover from being scratched and displaced or even falling off during use, thereby enhancing the waterproof and moisture-proof effects, improving the safety performance, and prolonging the service life of the power.

(4) Compared with the design of an ordinary vertical driving power with a key arranged on an end cover and a switch pressed in an axial direction, in the present invention, the key hole is arranged on the side surface of the power shell, and the circuit board with a perpendicularly arranged key column is adopted, when the key switch is pressed and used, the pressing force is perpendicular to the axial direction of the shell, the welding point of the key switch and the circuit board substrate share and disperse the pressing force, so that the key switch is not easy to tilt or even break off, which can prolong the service life of the power.

(5) Compared with the ordinary horizontal driving power, the vertical multi-function driving power provided by the present invention is simple in structural design, convenient in assembly, smaller in power volume, smaller in occupied area when powered on for use, thus saving the space. Moreover, according to the use situation, multiple groups of key switches may be arranged at different positions on the side surface of the shell, which is more flexible and convenient than arranging switches on the end cover.

BRIEF DESCRIPTION OF THE DRAWINGS

The accompanying drawings are used to provide a further understanding of the present invention and constitute a part of the specification, and to explain the present invention together with Embodiment 1 of the present invention, which do not constitute a limitation to the present invention.

The reference numerals in the drawings of the present invention: 1 denotes a shell, 11 denotes a key hole, 12 denotes a first extension portion, 13 denotes a second extension portion, 14 denotes a groove, 15 denotes a mounting block, 16 denotes a limiting block, 17 denotes a clamping slot, 18 denotes an input wiring hole, 2 denotes an end cover, 21 denotes an outer rib, 22 denotes a clamping block, 23 denotes an inner rib, 3 denotes a waterproof socket, 31 denotes an output wiring hole, 4 denotes a sealing cover, 41 denotes a cylindrical body, 42 denotes a horizontal extension portion, 43 denotes a lower edge portion, 44 denotes a key cap, 45 denotes a trigger part, 46 denotes a limiting flange, 5 denotes a circuit board, 51 denotes a substrate, 52 denotes a key column, and 6 denotes a conductive insertion.

DETAILED DESCRIPTION

The preferred embodiments of the present invention will be described in further detail below with reference to the accompanying drawings. It should be understood that the embodiments described here are only used to illustrate and explain the present invention, and are not used to limit the present invention.

As can be seen from FIG. 3 to FIG. 7, a vertical multi-function driving power provided by the present invention includes integrally formed shell 1, end cover 2, waterproof socket 3, sealing cover 4, and circuit board 5 of a control circuit. One end of shell 1 is closed, the other end is provided with an opening. The opening end of shell 1 is detachably connected to an inner side surface of end cover 2. Waterproof socket 3 is integrally formed on an outer side surface of end cover 2. A thread is arranged on an outer surface of waterproof socket 3, and output wiring hole 31 for connecting to an external LED device is arranged therein. The closed end of shell 1 is provided with input wiring hole 18 for fixedly mounting conductive insertion 6, for connecting circuit board 5 and a high-voltage power supply. Key hole 11 penetrates through an upper side surface of shell 1, an axial direction of key hole 11 is perpendicular to an axial direction of shell 1, and sealing cover 4 is mounted in key hole 11 to seal it. Circuit board 5 is provided with key column 52 perpendicular to substrate 51, for switching pulse signals.

Figure 8:
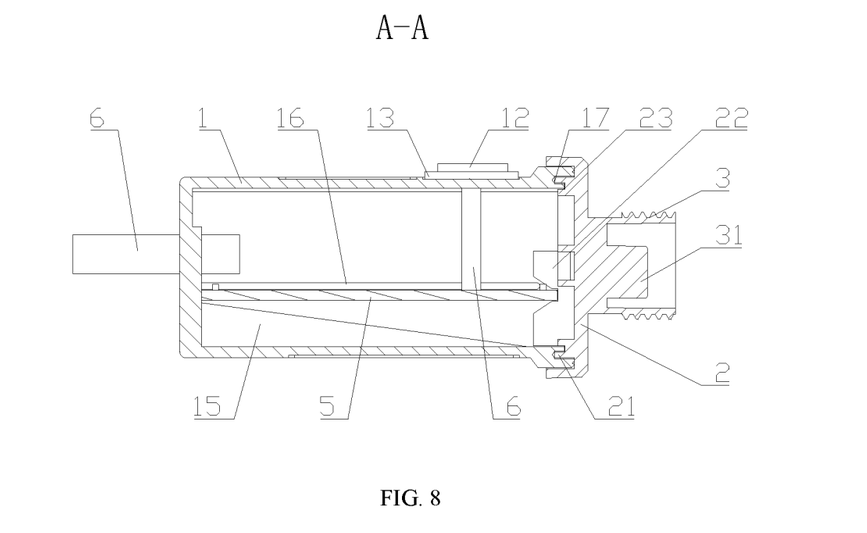
FIG. 8 is a schematic diagram of a cross-sectional structure of an "A-A" plane of FIG. 7.
Figure 9:
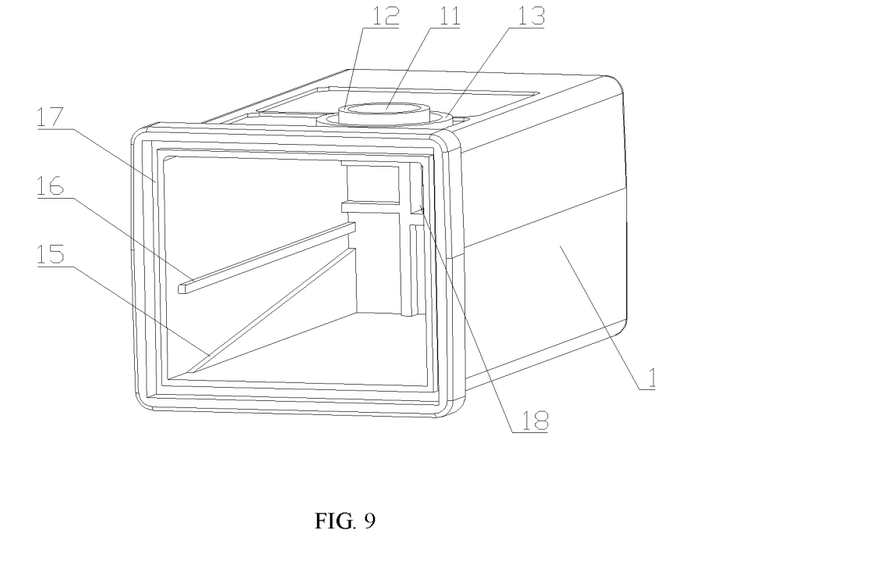
FIG. 9 is a schematic diagram of a three-dimensional structure of a shell according to the present invention.

As shown in FIG. 8 and FIG. 9, two inner side surfaces adjacent to the side surface where key hole 11 is located inside a cavity of shell 1 are provided with mounting blocks 15 symmetrically, and mounting blocks 15 are integrally formed with shell 1. An upper surface of mounting block 15 gradually extends straight upward from the opening end of shell 1 to the closed end of shell 1, and forms an included angle of 7.5 degrees with a lower side surface of shell 1. The two inner side surfaces where mounting blocks 15 are located are each provided with limiting block 16, and limiting block 16 is integrally formed with shell 1. Limiting block 16 is located above mounting block 15 and is parallel to the axial direction of shell 1. A gap between mounting block 15 and limiting block 16 is used for mounting circuit board 5.

Figure 10:
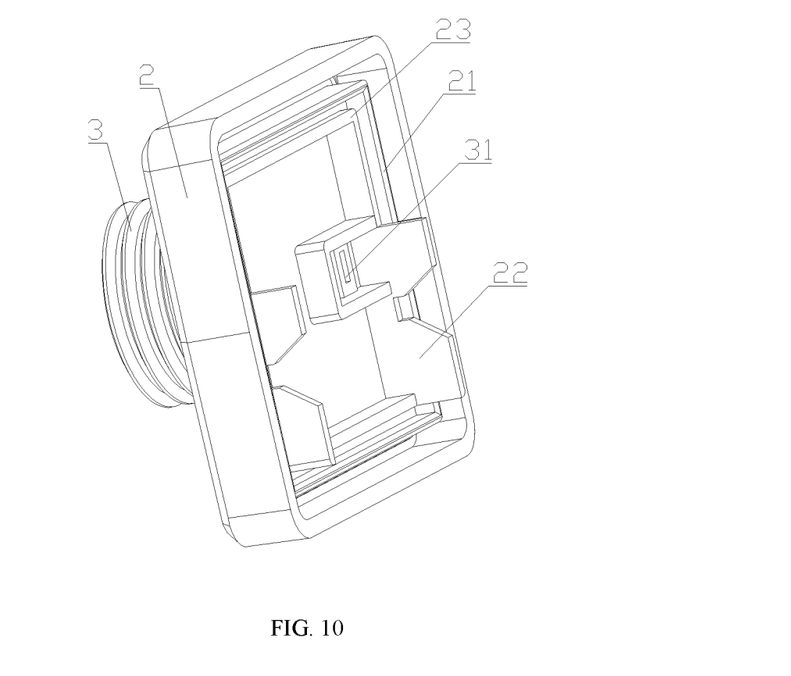
FIG. 10 is a schematic diagram of a three-dimensional structure of an end cover according to the present invention.
Figure 11:
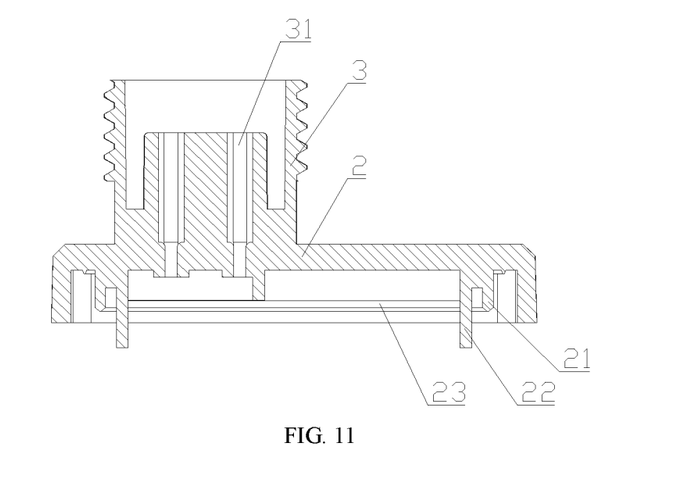
FIG. 11 is a schematic diagram of a cross-sectional structure of the end cover according to the present invention.

As can be seen with reference to FIG. 10 and FIG. 11, clamping blocks 22 are arranged symmetrically on the inner side surfaces of end cover 2, and clamping blocks 22 each have a "Y"-shaped notch. When the opening end of shell 1 and end cover 2 are connected together, the "Y"-shaped notch of clamping block 22 is clamped with one end of circuit board 5, mounting block 15 and clamping block 22 fix circuit board 5 in a position inside the cavity of shell 1 and parallel to an axial direction thereof, clamping block 22 completely protrudes into the cavity of shell 1, and a movable end of key column 52 protrudes into key hole 11 and is closely attached to sealing cover 4.

As can be seen from FIG. 8 and FIG. 10 to FIG. 11, an inner surface and an outer surface of the opening end of shell 1 respectively extend outward and form non-closed clamping slot 17 in the middle. The inner side surface of end cover 2 is provided with outer rib 21 that is in clamping fit with clamping slot 17. An inner ring of outer rib 21 is provided with inner rib 23, and clamping block 22 is arranged on inner rib 23. When end cover 2 is closed and connected to the opening end of shell 1, outer rib 21 is clamped in clamping slot 17, and inner rib 23 is closely attached to the inner surface of the opening end of shell 1. Through the mutual clamping of outer rib 21, inner rib 23, and clamping slot 17, and mutual fitting of the shell of end cover 2 and clamping block 22, the stability of mutual connection between end cover 2 and shell 1 as well as desirable double-layer sealing and waterproof effects are ensured.

As shown in FIG. 3 to FIG. 5 and FIG. 8 to FIG. 9, one end of key hole 11 opposite to the outer surface of shell 1 extends outward to form first extension portion 12, second extension portion 13 integrally formed with shell 1 is arranged surrounding the exterior of first extension portion 12, and groove 14 is formed between second extension portion 13 and first extension portion 12. The height of first extension portion 12 is greater than the height of second extension portion 13. By arranging first extension portion 12, water vapor is prevented from entering key hole 11 from the exterior of the shell and flowing into the interior of the power. By arranging second extension portion 13, the edge of sealing cover 4 mounted in key hole 11 can be prevented from being easily scratched and displaced and falling off during use, thereby enhancing the waterproof and moisture-proof effects.

Figure 12:
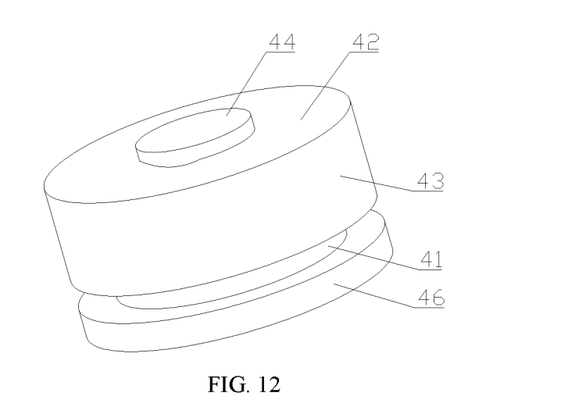
FIG. 12 is a schematic diagram of a three-dimensional structure of a sealing cover according to the present invention.
Figure 13:
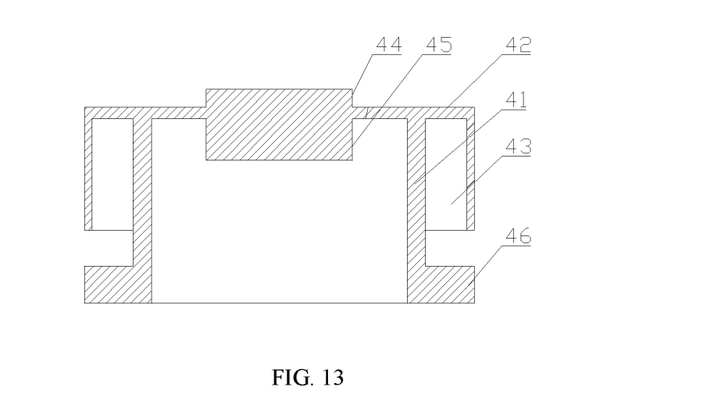
FIG. 13 is a schematic diagram of a cross-sectional structure of a sealing cover according to the present invention.

As shown in FIG. 12 and FIG. 13, sealing cover 4 used together with key hole 11 includes cylindrical body 41 and a cover top. One end of cylindrical body 41 is closed to form a cover top, and the other end is provided with an opening. The cover top includes horizontal extension portion 42, lower edge portion 43, and key cap 44 located on horizontal extension portion 42. The diameter of horizontal extension portion 42 is slightly greater than the diameter of key hole 11. When cylindrical body 41 is inserted into key hole 11, horizontal extension portion 42 and lower edge portion 43 wrap the exterior of first extension portion 12, and play a role of sealing and waterproof. The length of lower edge portion 43 is ⅔ of the length of cylindrical body 41. The length of lower edge portion 43 is prolonged, so that it can better wrap first extension portion 12 to enhance the sealing and waterproof effects. Sealing cover 4 is made of a silicone material.

As can be seen from FIG. 13, key cap 44 extends to the interior of cylindrical body 41 to form trigger part 45. After circuit board 5 is mounted in shell 1, key column 52 can be tightly pressed against the surface of trigger part 45, and key cap 44 is pressed externally. Key column 52 is pressed by trigger part 45, thereby forming a channel to generate a pulse signal. An edge of the opening end of cylindrical body 41 extends radially around to form limiting flange 46, the diameter of limiting flange 46 is slightly greater than the diameter of key hole 11. Limiting flange 46, after passing through key hole 11, is closely attached to the inner surface of shell 1, for fixing the position of sealing cover 4 and preventing it from falling off.

During mounting and use, sealing cover 4 is inserted into key hole 11 so that horizontal extension portion 42 and lower edge portion 43 wrap the exterior of first extension portion 12, and limiting flange 46 abuts against the inner side of the upper surface of shell 1. Circuit board 5 is placed on the surfaces of two mounting blocks 15, and pushed into the interior of shell 1 in an inclined manner along the upper surfaces of mounting blocks 15. An input end wiring terminal of circuit board 5 is connected to conductive insertion 6 fixedly mounted in input wiring hole 18. End cover 2 and the opening end of shell 1 are clamped and closed to each other, the "Y"-shaped notch of clamping block 22 is clamped with one end of circuit board 5, and circuit board 5 is lifted and fixed to a position parallel to the axial direction of shell 1. End cover 2 is tightly closed on the opening end of shell 1, and the conductive insertion arranged on output connection hole 31 is connected to an output end wiring terminal on the circuit board. At this time, a movable end of key column 52 arranged on circuit board 5 can just protrude into key hole 11 and is closely attached to trigger part 45 of sealing cover 4 mounted in key hole 11. Conductive insertion 6 in input wiring hole 18 and output wiring hole 31 are respectively connected to the power supply and the LED device, key cap 44 on sealing cover 4 is pressed to drive key column 52 to trigger the circuit switch to form a channel, thus generating a corresponding pulse signal, thereby controlling the LED external device to switch between different lighting modes.

The foregoing descriptions are only preferred embodiments of the present invention and are not intended to limit the present invention. Although the present invention has been described in detail with reference to the foregoing embodiments, those skilled in the art can make modifications on technical solutions recorded in the previous embodiments, or make equivalent replacement on some of the technical features. Any modification, equivalent replacement, improvement, or the like made within the spirit and principle of the present invention should be included in the protection scope of the present invention.

The invention claimed is:

1. A vertical multi-function driving power, comprising an integrally formed shell, an end cover, a waterproof socket, a sealing cover, and a circuit board of a control circuit, wherein one end of the shell is closed and the other end is provided with an opening, the opening end of the shell is detachably connected to an inner side surface of the end cover, the waterproof socket is integrally formed on an outer side surface of the end cover, at least one key hole penetrates through an upper side surface of the shell, and the sealing cover is mounted in the key hole to seal it;

the circuit board is provided with a key column perpendicular to a substrate, and two inner side surfaces adjacent to the side surface where the key hole is located inside a cavity of the shell are provided with mounting blocks symmetrically, clamping blocks are arranged symmetrically on the inner side surfaces of the end cover, and the clamping blocks each have a "Y"-shaped notch, when the opening end of the shell and the end cover are connected together, the "Y"-shaped notch of the clamping block is clamped with one end of the circuit board, the mounting block and the clamping block fix the circuit board in a position inside the cavity of the shell and parallel to an axial direction thereof, the clamping block completely protrudes into the cavity of the shell, and a movable end of the key column protrudes into the key hole and is closely attached to the sealing cover;

wherein an upper surface of the mounting block gradually extends straight upward from the opening end of the shell to the closed end of the shell, and forms an included angle of 0 to 45 degrees with a lower side surface of the shell;

wherein the included angle formed between the upper surface of the mounting block and the lower side surface of the shell is 0 to 15 degrees.

2. The vertical multi-function driving power according to claim 1, wherein the two inner side surfaces where the mounting blocks are located are each provided with a limiting block, the limiting block is located above the mounting block and parallel to the axial direction of the shell, and a gap between the mounting block and the limiting block is used for mounting the circuit board.

3. The vertical multi-function driving power according to claim 1, wherein an inner surface and an outer surface of the opening end of the shell respectively extend outward and form a non-closed clamping slot in the middle, and the inner side surface of the end cover is provided with an outer rib that is in clamping fit with the clamping slot.

4. The vertical multi-function driving power according to claim 1, wherein one end of the key hole opposite to the outer surface of the shell extends outward to form a first extension portion, a second extension portion integrally formed with the shell is arranged surrounding the exterior of the first extension portion, a groove is formed between the second extension portion and the first extension portion, and the height of the first extension portion is not lower than the height of the second extension portion.

5. The vertical multi-function driving power according to claim 1, wherein the sealing cover is made of an elastic material and comprises a cylindrical body and a cover top, one end of the cylindrical body is closed to form a cover top, and the other end is provided with an opening, the cover top comprises a horizontal extension portion, a lower edge portion, and a key cap located on the horizontal extension portion, and the diameter of the horizontal extension portion is slightly greater than the diameter of the key hole; when the cylindrical body is inserted into the key hole, the horizontal extension portion and the lower edge portion wrap the exterior of the first extension portion, and the length of the lower edge portion is ⅔ of the length of the cylindrical body.

6. The vertical multi-function driving power according to claim 5, wherein the key cap extends to the interior of the cylindrical body to form a trigger part, and an edge of the opening end of the cylindrical body extends radially around to form a limiting flange, the diameter of the limiting flange is slightly greater than the diameter of the key hole, and the limiting flange, after passing through the key hole, is closely attached to the inner surface of the shell.

7. The vertical multi-function driving power according to claim 1, wherein the waterproof socket is provided with a thread on an outer surface thereof and an output wiring hole therein.

8. The vertical multi-function driving power according to claim 1, wherein the closed end of the shell is provided with an input wiring hole, and a conductive insertion is sealed and fixedly mounted in the input wiring hole.

\* \* \* \* \*